United States Patent

Hugenholtz

[15] 3,688,212

[45] Aug. 29, 1972

[54] FREQUENCY SYNTHESIS SYSTEM

[72] Inventor: Eduard Herman Hugenholtz, Toronto, Ontario, Canada

[73] Assignee: U.S. Phillips Corporation, New York, N.Y.

[22] Filed: March 19, 1971

[21] Appl. No.: 126,184

[30] Foreign Application Priority Data

March 23, 1970 Canada........................078082

[52] U.S. Cl...........................................331/4, 331/19

[51] Int. Cl.................................................H03b 3/08

[58] Field of Search....................................331/19, 4

*Primary Examiner*—John Kominski

*Attorney*—Frank R. Trifari

[57] ABSTRACT

In one embodiment of the invention the frequency of a oscillator is locked to the harmonic of the output of a reference frequency voltage generator by feeding the output voltages from the controllable oscillator and the reference generator to a mixer, capable of producing a direct current voltage output, to produce a control voltage for achieving a locked-in condition or a harmonic of the reference frequency generator output and wherein the output voltage from a further reference frequency generator is mixed with the output of the controllable oscillator to produce a lock disturbing control voltage when the harmonic of the reference generator upon which locked in operation is achieved does not correspond to a particular harmonic of the output frequency of the further reference frequency generator. The frequencies of the reference generators are locked with respect to each other by a divider-frequency discriminator control circuit.

5 Claims, 2 Drawing Figures

Figure 1:
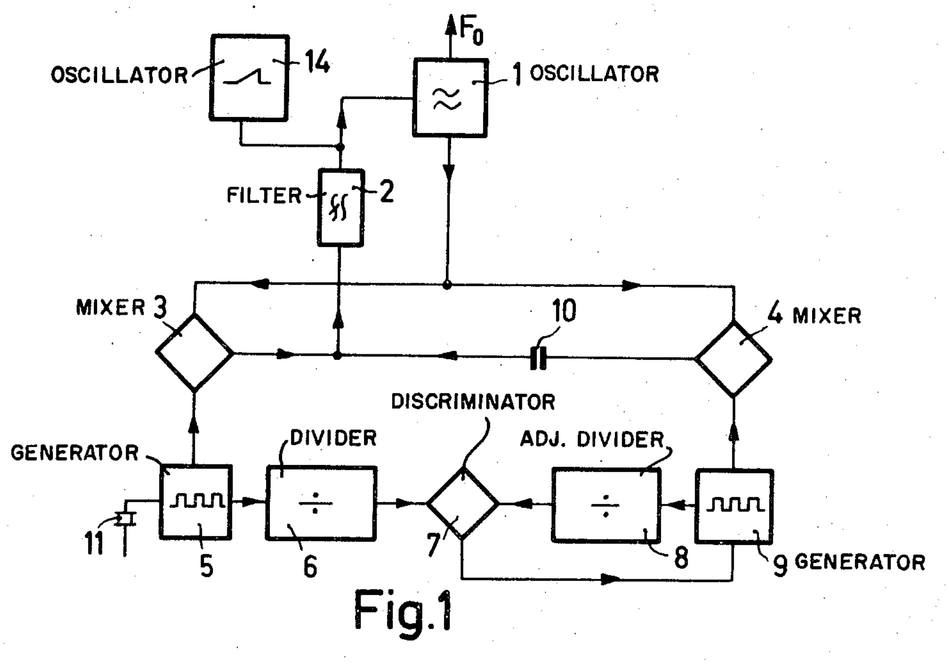

INVENTOR.

BY EDUARD HERMAN HUGENHOLTZ

AGENT

FREQUENCY SYNTHESIS SYSTEM

This invention relates to a frequency synthesis system wherein a controllable frequency oscillator is locked to the harmonic of the output of a reference frequency generator by means of a mixer to which the outputs of the controllable oscillator and the reference frequency generator are fed. The mixer produces an output voltage when the frequencies of the input voltages are out of phase and harmonically related i.e. a beat signal or a direct current output voltage is produced by the mixer. Since the mixer produces an output down to zero beat, the polarity of the direct current voltage is determined by the phase relationship between the input frequencies as the beat frequency approaches zero.

In known frequency control arrangements, using the system of control described above, it is possible to lock on different harmonics of the reference generator, and a difficulty arises in achieving locked-in operation on a particular harmonic especially when the fundamental frequency of the reference generator is low with respect to the frequency of the harmonic upon which locked-in operation is desired. Usually tuned circuit type frequency discrimination is employed however, for high frequency operation, it may be difficult to achieve a band width of the tuned circuits sufficient to discriminate between adjacent harmonics of the output of the reference generator.

It is therefore a prime object of the present invention to provide a frequency synthesis system wherein locked-in operation of a controllable frequency oscillator can be achieved without ambiguity on a particular harmonic of the output of a reference frequency generator.

It is a further object to provide a frequency synthesis system which is not dependent on the use of critically tuned frequency selective circuits.

In accordance with one embodiment of the invention the frequency of the controllable oscillator is locked to the harmonic of the output of a reference frequency voltage generator by feeding the output voltages from the controllable oscillator and the reference generator to a mixer capable of producing a direct current voltage output to produce a control voltage for achieving either a locked-in condition or a harmonic of the reference frequency generator output and wherein the output voltage from a further reference frequency generator is mixed with the output of the controllable oscillator to produce a lock disturbing control voltage when the harmonic of the reference generator upon which locked-in operation is achieved but does not correspond to a particular harmonic of the output frequency of the further reference frequency generator. The frequencies of the reference generators are locked with respect to each other by a divider-frequency discriminator control circuit.

In a further embodiment of the invention variable dividers are employed to provide the possibility of locked-in operation on a greater number of harmonics of the output of the reference frequency generator.

Figure 2:
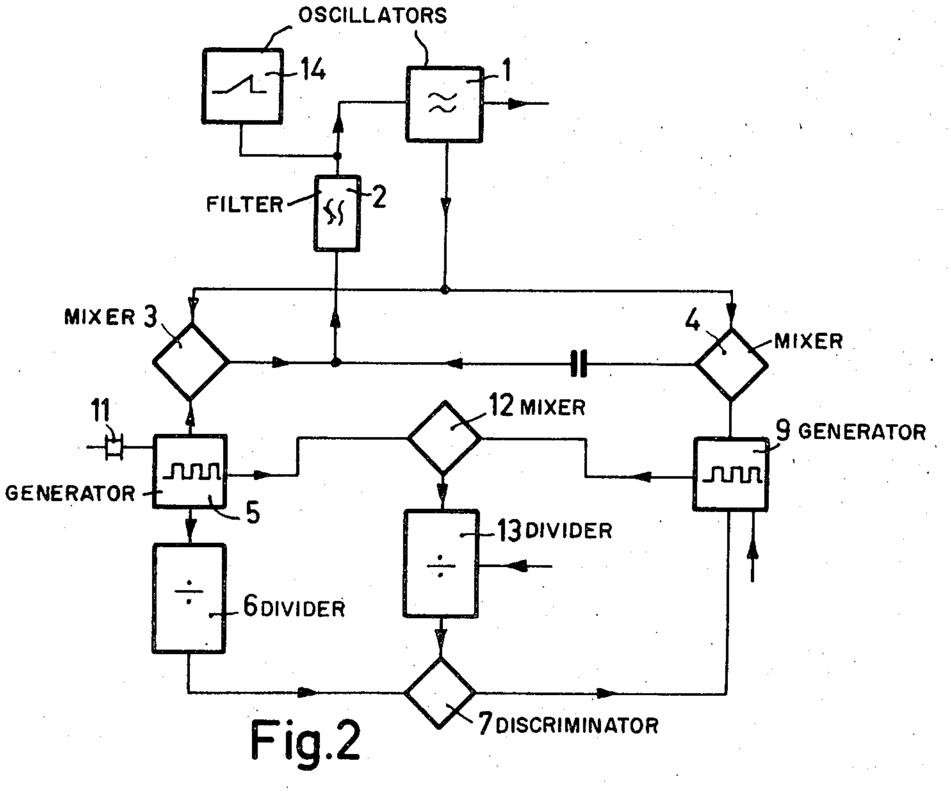

Further objects and advantages of the invention will appear from the reading of the following description of the invention related to the drawings in which, FIG. 1 shows a schematic diagram, in block form, of an embodiment of the invention, and FIG. 2 shows a modification of the embodiment shown in FIG. 1 wherein provision is made to allow a greater variation of the frequencies upon which locked-in operation may be achieved.

Referring to FIG. 1 an oscillator 1 is designed to operate at a frequency which is a desired multiple of the frequency of a pulse spectrum generator 5 which is diagrammatically shown as being crystal controlled by means of a crystal element 11.

Pulse spectrum generator 5 supplies the pulse spectrum, i.e. harmonics of the pulse repetition frequency of pulse generator 5 ($F_1$) to mixer 3 to which is also supplied the output voltage of oscillator 1. The mixer 3, when fed by an oscillator voltage which is in harmonic relationship with the pulse repetition frequency of pulse generator 5, produces no output but if the frequency of the oscillator 1 tends to shift from the harmonic relationship with pulse generator 5 an output voltage is produced which is supplied as a control voltage by means of a low pass filter 2 to oscillator 1 to counteract the tendency of the frequency of oscillator 1 to shift.

The system as thus far described scribed is known in the art and subject to the main disadvantage that locking can take place on one of several harmonics of the pulse repetition frequency of oscillator 5 which harmonics lie within the controlled tuning range of oscillator 1. Thus, the frequency of oscillator 1 may be different than that actually desired — i.e. false locking may place.

In order to overcome the stated disadvantage and ensure locking on the desired harmonic, further control circuitry, in accordance with the present invention, is added. To this end, the output voltage of pulse generator 5 is fed to a divider 6 dividing by a factor n to produce the resultant output pulse frequency of $F1/n$ which is in turn fed to a phase detector 7.

A further pulse generator 9, also producing a pulse spectrum output and at a pulse repetition frequency $F_2$, is controlled by the output of phase detector 7. The output voltage $F_2$ of pulse generator 9 is fed to a frequency divider 8 which divides by the factor $(n+1)$ to produce an output voltage $F2/(n+1)$ which is fed to the phase detector 7. Phase detector 7 is designed to produce zero output control voltage when the frequency $$\frac{F_1}{n}=\frac{F_2}{n+1}, \text{ or } F_2\frac{(n+1)}{n}F_1$$

This relationship can also be stated as being $$nF_2=(n+1)F_1.$$

In other words, phase lock of pulse generator 9 takes place when the $n^{th}$ harmonic of its output frequency $F_2$ is equal to the $(n+1)^{th}$ harmonic of the fundamental frequency of $F_1$.

The pulse output voltage of generator 9 is supplied, in addition to divider 8, to a pulse mixer 4 to which the oscillatory output voltage of the controlled oscillator 1 is supplied. If the frequencies of the two signal voltages applied to mixer 4 are in phase, i.e. the controlled oscillator 1 is operating at the $n^{th}$ harmonic of $F_2$ or conversely the $(n+1)^{th}$ harmonic of $F_1$, then no beat signal is produced and there is no lock disturbing signal supplied by capacitor 10 to the control circuit of oscillator 1. However, if the frequency of the controlled oscillator 1 is locked to a harmonic of $F_1$ other than the $(n+1)^{th}$ then a beat voltage is produced in mixer 4 and this is fed to the control circuit of oscillator 1. In order to ensure that lock will take place on the $(n+1)^{th}$ harmonic, a ramp oscillator 14 is connected to supply a frequency sweeping voltage, for instance of sawtooth wave-shape, to the control circuit of oscillator 14. The ramp oscillator should be controlled to an inoperative condition when correct locking is achieved; one means of accomplishing this is to make the operation of the ramp oscillator 14 dependent on the presence of a beat output signal from mixer 4.

Although the embodiment of the invention described with reference to FIG. 1 provided locking on a specific harmonic of the pulse oscillator 5 a variety of locking frequencies can be obtained by providing for changing of the dividing factors of either or both dividers 6, 8 as will be obvious to those in the art.

In a further embodiment, the use of divider 8 has been eliminated and the beat frequency between the frequencies of pulse oscillators 5, 9 for frequency control purposes is phase compared with the divided output of pulse generator 9. For example, the difference frequency $F_2 - F_1 = F_1/n$ or $nF_2 = (n+1) F_1$ which is the desired frequency relationship. The control circuitry can be the same as shown in FIG. 1.

The further embodiment is shown in FIG. 2 wherein parts performing the same function as parts in FIG. 1 are similarly designated. Samples of the pulse spectrum outputs of pulse generators 5 and 9 are mixed in a mixer 12 to produce a pulse beat spectrum output, the lowest beat frequency of which corresponds to the difference in fundamental frequencies of the pulse generators, i.e. $F_2 - F_1$. The beat frequencies are supplied through a divider 13 to a phase detector 7. In addition the output of pulse generator 5 is fed to divider 6 which divides the frequency of pulse generator by a predetermined factor. The output of divider 6 is supplied to detector 7. The output voltage of detector 7 is used to control the fundamental frequency of pulse generator 9 so that the correct frequency relation is maintained.

The remaining parts of the system may be identical to FIG. 1 and operate in the same manner to control the frequency of controlled oscillator 1 to lock on a desired harmonic of the fundamental frequency of pulse generator 5.

In operation of the system of FIG. 2 and also considering the dividing factor of divider 6 to be $n$ and that of divider 13 to be 1, then it follows that $$\frac{F_1}{n} = F_2 - F_1 \text{ or } F_2 = \frac{(n+1)}{n} F_1$$

which is the same result as obtained from the system of FIG. 1.

If it is desired to change the controlled frequency of oscillator 1, this can be accomplished by changing either or both of the dividing factors of dividers 6 and 13. For instance, if divider 13 divides by 2 and divider 6 by $n$ locking of the frequency of oscillator 1 takes place when $$F_1/n = F_2 - F_1/2$$

whereafter it follows that $$F_2 = \frac{(n+2)}{n} F_1$$

This means that locking of the controlled oscillator 1 will take place on the $(n+2)^{th}$ harmonic of crystal controlled oscillator 5.

It will be obvious that many modifications which do not depart from the spirit and scope of the invention described herein will occur to those skilled in the art. For example, it will be obvious that a wide range of frequencies upon which locking of the controlled oscillator may take place can be provided by varying the fundamental frequency of pulse generator 5 as well as the division ratios of the dividers.

What is claimed is:

1. In a frequency synthesis system, an oscillator the frequency of which is controllable by means of a control circuit to which a control voltage is supplied, a first reference frequency oscillator, a first mixer capable of producing a direct-current output, having its output connected to the control circuit, means feeding voltages representative of the outputs of the oscillator and the first reference generator to the first mixer to produce an output voltage, a second reference frequency generator, a second mixer, means feeding voltages representative of the outputs of the oscillator and the second reference frequency generator to the second mixer to produce and output beat frequency voltage when the inputs to the second mixer are not in phase, means connecting the output of the second mixer to the control circuit to disturb the locked in frequency of the oscillator which does not relate harmonically to a harmonic of the output of the second reference generator and means controlling the fundamental frequencies of the output voltages of the reference generators with respect to each other.

2. In a frequency synthesis system as claimed in claim 1 wherein the means controlling the fundamental frequencies of the output voltages of the reference generators includes a frequency divider for each reference generator and a phase comparing device for the frequencies resulting from the operation of the dividers.

3. In a frequency synthesis as claimed in claim 1, wherein the dividing ratio of at least one of the dividers is adjustable.

4. In a frequency synthesis system, an oscillator the frequency of which is controllable by means of a control circuit to which a control voltage is supplied, a first reference oscillator, a first mixer capable of producing a direct-current output, having its output connected to the control circuit, means feeding voltages representative of the outputs of the oscillator and the first reference generator to the first mixer to produce an output voltage, a second reference frequency generator, a second mixer, means feeding voltages representative of the outputs of the oscillator and the second reference frequency generator to the second mixer to produce and output beat frequency voltage when the inputs to the second mixer are not in phase, means connecting the output of the second mixer to the control circuit to disturb the locked in frequency of the oscillator which does not relate harmonically to a harmonic of the output of the second reference generator, first and second frequency dividers, a phase detector device, means feeding the outputs of the first and second reference frequency generators to the first and second dividers respectively, means connecting the outputs of said dividers to the phase detector to compare the divided frequency outputs thereof and produce a control voltage representative of the difference in frequencies of the divided frequency outputs, means connecting the output of the phase detector to a frequency control circuit of one of the reference frequency generators to control the frequency of that generator with respect to the frequency of the other generator.

5. In a frequency synthesis system as claimed in claim 4 wherein the dividing ratio of at least one of the dividers is adjustable.

* * * * *